(12) United States Patent
Koutsoures

(10) Patent No.: US 8,022,727 B2
(45) Date of Patent: Sep. 20, 2011

(54) ELECTRONIC CLAMPS FOR INTEGRATED CIRCUITS AND METHODS OF USE

(75) Inventor: Dennis Koutsoures, Oak Park, IL (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/864,241

(22) PCT Filed: Jan. 27, 2009

(86) PCT No.: PCT/IB2009/050330
§ 371 (c)(1),
(2), (4) Date: Jul. 23, 2010

(87) PCT Pub. No.: WO2009/095858
PCT Pub. Date: Aug. 6, 2009

(65) Prior Publication Data
US 2010/0295595 A1    Nov. 25, 2010

(30) Foreign Application Priority Data
Jan. 29, 2008  (EP) ..................................... 08101052

(51) Int. Cl.
H03K 19/0175    (2006.01)

(52) U.S. Cl. .............................. 326/82; 326/80; 327/309

(58) Field of Classification Search ..................... 326/82; 327/309, 319, 320, 327, 328, 313
See application file for complete search history.

(56) References Cited

U.S. PATENT DOCUMENTS

| | | | |
|---|---|---|---|
| 5,034,845 A | 7/1991 | Murakami | |
| 6,897,703 B2* | 5/2005 | Hunt | 327/313 |
| 7,348,804 B2* | 3/2008 | Hoberman et al. | 326/82 |
| 2004/0139361 A1 | 7/2004 | Flynn | |
| 2004/0158750 A1 | 8/2004 | Syed et al. | |
| 2006/0006929 A1* | 1/2006 | Caplan et al. | 327/546 |
| 2007/0001721 A1* | 1/2007 | Chen et al. | 327/143 |
| 2007/0085583 A1 | 4/2007 | Zohar | |
| 2007/0109882 A1* | 5/2007 | Taniguchi et al. | 365/200 |

FOREIGN PATENT DOCUMENTS

| | | |
|---|---|---|
| GB | 2 421 105 A | 6/2006 |
| WO | 2004/077638 A1 | 9/2004 |
| WO | 2007/007237 A2 | 8/2007 |

(Continued)

OTHER PUBLICATIONS

Jitaru, Ionel Dan "Self-Driven Constant Voltage Reset Circuit," IEEE, pp. 893-897 (2003).

(Continued)

Primary Examiner — Shawki S Ismail
Assistant Examiner — Crystal L Hammond

(57) ABSTRACT

An electronic clamp is provided for an integrated circuit having a first voltage island (1) to which an output signal (clamp out) of the clamp is applied and a second voltage island (2) operative to produce an input signal (clamp in) to the clamp, where power to the second voltage island can be switched off to save power. The clamp comprises a latch (22) which stores or retains the clamp value (0 or 1) of the input signal (clamp in) during a reset period and clamps the output signal (clamp out) to the stored or retained value in response to a clamp enable signal, (clamp in) in order to protect the first voltage island from a non-stabilised input signal.

7 Claims, 2 Drawing Sheets

FOREIGN PATENT DOCUMENTS

WO 2008/083369 A1 7/2008

OTHER PUBLICATIONS

Mak, Wai-Kei, et al. "Voltage Island Generation Under Performance Requirement for SoC Designs," IEEE; p. 798-803 (2007).

Yuan, Lin "Design Space Re-Engineering for Power Minimization in Modern Embedded Systems,", dissertation, Univ. of Md. College Park, 158 pages (2006).

International Search Report and Written Opinion for Int'l. Patent Appln. No. PCT/IB2009/050330 (Jan. 27, 2009).

* cited by examiner

| | Inputs: | | | Internal | | Outputs: |
|---|---|---|---|---|---|---|
| | reset_an | clamp_en | clamp_in | E | Q | clamp_out |
| a | 0 | 0 | 0 | 1 | 0 | 0 |
| b | 0 | 0 | 1 | 1 | 1 | 1 |
| c | 0 | 1 | X | 0 | Q | Q |
| d | 0 | 1 | X | 0 | Q | Q |
| e | 1 | 0 | 0 | 0 | Q | 0 |
| f | 1 | 0 | 1 | 0 | Q | 1 |
| g | 1 | 1 | X | 0 | Q | Q |
| h | 1 | 1 | X | 0 | Q | Q |

ELECTRONIC CLAMPS FOR INTEGRATED CIRCUITS AND METHODS OF USE

This invention relates to electronic clamps for integrated circuits, particularly application specific integrated circuits (ASICs), and to methods of use of such circuits.

Electronic clamps are widely used in integrated circuits for devices which must conserve power, such as mobile phones or consumer hand-held devices. Modern ASIC designs typically employ a concept called voltage island power saving. In this concept, the ASIC may contain voltage islands (or domains) which, depending on the operating mode, can be switched off to conserve power while others remain switched on.

It is imperative that an input to an active voltage island be clamped if that input is connected to, or being driven by, a voltage island which is powered off. Failure to clamp these signals can result in undesirable circuit behaviour. Known electronic clamps are designed to clamp a signal to either a logic level 1 or a logic level 0.

Determining which clamp should be used for any particular input is typically done by hand using manually generated scripts. A complex ASIC may have many voltage islands each with hundreds of inputs so determining the type of clamp for each input is typically an iterative, time-consuming and error-prone process. Currently, engineers develop their own methods for determining a clamp type and insertion of the clamp. Using an iterative process, the engineer initially assumes all clamps to clamp to logic 0. The engineer then runs a simulation to compare the clamp value to that of the reset value of the input signal. If they do not match the engineer replaces that clamp with the clamp of the correct type. This process must be done each time the circuit is changed or altered in order to guarantee clamp correctness.

According to the invention there is provided an electronic clamp for an integrated circuit having a first voltage island to which an output signal of the clamp is applied and a second voltage island operable to produce an input signal to the clamp, power to the second voltage island being capable of being switched off in a power-off period and switched on in a power reset period, wherein the clamp comprises a latch operable to store or retain the clamp value of the input signal during the reset period and to clamp the output signal to the stored or retained value in response to a clamp enable signal, in order to protect the first voltage island from a non-stabilised input signal.

Preferably, the latch is operative to clamp the output signal to the retained or stored value when power switch-off to the second voltage island commences. Also, the latch may be operative to clamp the output signal to the retained or stored value when power switch-off to the second voltage island has just terminated.

In the preferred embodiment, the latch is enabled by a signal from a NOR gate, the inputs to which are the clamp enable signal and a reset-an signal which signifies switching on of the power to the second voltage island.

The output of the latch may be connected to one input terminal of a multiplexer another input terminal of which is fed by the input signal, the multiplexer having an output terminal carrying the output signal of the clamp.

The invention further provides a method of operating an electronic clamp in an integrated circuit having a first voltage island to which an output signal of the clamp is applied and a second voltage island which is operative to produce an input signal to the clamp and the power to which is capable of being switched off in a power-off period and switched on in a power reset period, the method comprising storing or retaining in the clamp the value of the input signal during the reset period and clamping the output signal to the stored or retained value of the input signal in response to a clamp enable signal, in order to protect the first voltage island from a non-stabilised input signal.

A clamp according to the invention will automatically determine the correct clamp value to be adopted, based on the clamp value of the input during reset. The engineer needs to install once only as the clamp will automatically adopt the correct clamp value during reset, after which the output will be clamped to the required value by the latch.

The prior art and an embodiment of invention will now be further described, by way of example, with reference to the accompanying drawings in which.

Figure 1:
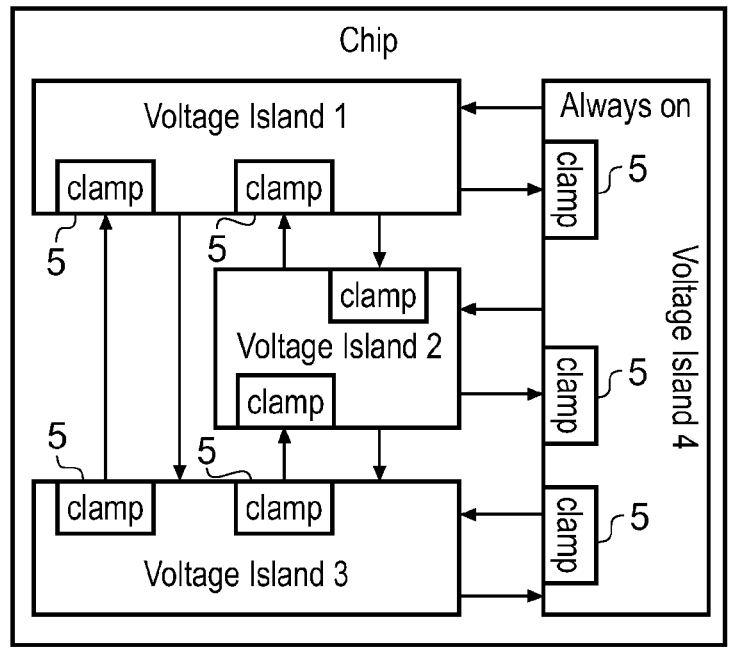
FIG. 1 illustrates four voltage islands in an ASIC chip.

The electronic circuit chip shown diagrammatically in FIG. 1 has four voltage islands (or domains) 1 to 4. Voltage islands 1 to 3 can be switched off to save power. Voltage island 4 is always on, i.e. always powered. Where any voltage island receives an input signal from another island which can be switched off, the receiving island needs a clamp 5 because the input signal may float. Inputs from the always-on island 4 do not need clamps because these inputs never float as the island 4 is never switched off. Determining the clamp value for inputs which can float is a technically difficult task which the invention tackles.

Figure 2:
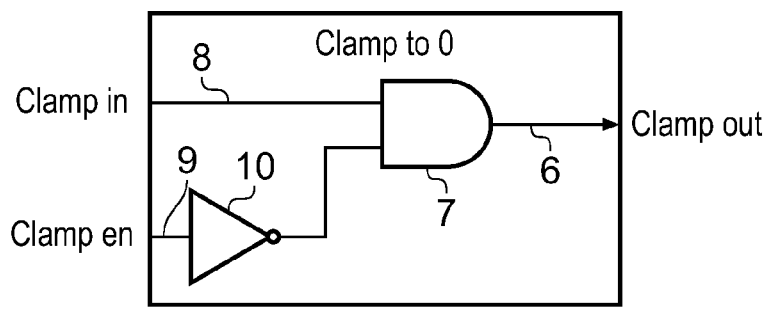
FIGS. 2 and 3 illustrate known clamps for clamping to 0 and 1 respectively.

FIG. 2 illustrates a known clamp which is a dedicated logic 0 clamp, that is the clamp value at its output 6 is zero. The clamp has an AND gate 7 supplied with a clamp in signal 8 and a clamp enable signal 9 fed through an inverter 10.

Figure 3:
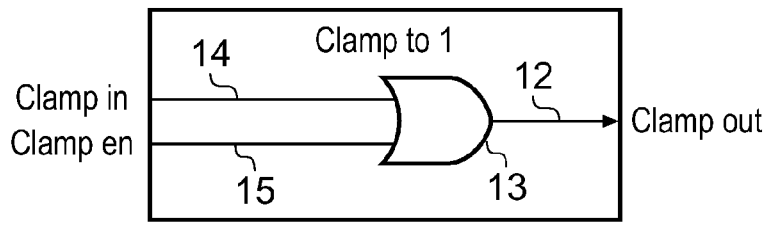

The clamp of FIG. 3 is a dedicated logic 1 clamp, that is the clamp value at its output 12 is one. This clamp has an OR gate 13 supplied with clamp in and clamp enable signals 14, 15 respectively.

Figures 4, 5:
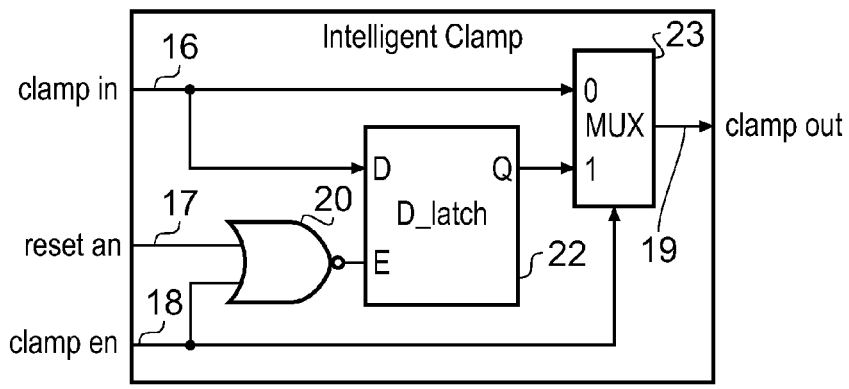
FIG. 4 is a block circuit diagram illustrating a clamp according to the invention.
FIG. 5 is a table showing the possible states of the various signals in the operation of the clamp of FIG. 4.

The "intelligent" clamp of FIG. 4 is constructed in accordance with an embodiment of the invention and has three inputs, namely a clamp in signal 16, a reset-an signal 17 and a clamp enable signal 18. The clamp has a single output 19 designated clamp out. The clamp in signal 16 is the signal which is received by the host island, island 1 in this described example. This input signal is sent to island 1 by another island which can be powered off, island 2 in this described example.

The reset-an signal 17 is the signal which signifies the restitution of power to the island which has been powered off, i.e. island 2. The reset-an signal 17 is generated by a reset generation unit located in an always-on island, such as island 4.

The clamp enable signal 18 is powered by a power mode controller which is also based in an always on voltage island, such as island 4.

When electrical power is restored to the island 2 which has been switched off, the power mode controller will signal reset for that island by changing the clamp enable signal 18 to the appropriate logic value. The chip employs active low reset, meaning that logic 0 for the signal 17 indicates reset and logic 1 indicates no reset.

The reset-an and clamp enable signals 17, 18 are fed as inputs to a NOR gate 20 the output of which is connected to the enable terminal E of a D-latch 22. The disable terminal D of the latch 22 receives the clamp in signal 16 which is also conducted to the zero input of a multiplexer 23. The output state of the latch 22 is fed to the 1 input of the multiplexer 23.

The table of FIG. 5 shows in its eight horizontal lines or rows a to h the eight possible signal states arising from the eight possible combinations of the three input signals 16, 17 and 18.

Rows a and b show an active reset, for example during initial boot-up of the circuit. In rows a and b, the reset-an signal 17 is enabled (it is zero) and during this reset period the latch 22 is enabled and stores the reset value of the clamp in signal 16. The value of the output signal 19 corresponds to the clamp value of the input signal 16 during this reset period The clamp enable signal 18 is zero signifying that the latch 22 is not to be clamped.

Rows c and d illustrate the signal states when the power mode controller has switched on power to the island 2 and reset has been applied by the reset generator unit. Accordingly, reset-an 17 is zero and clamp enable 18 is one. Until power has stabilised, the power mode controller maintains the clamp enable signal 18 at logic 1, forcing the clamp out signal 19 to correspond to the latch value. The X in the table means that the value of that signal is irrelevant to operation of the clamp.

Rows e and f show the normal un-clamped operational mode in which power to the island 2 is on and the clamp in signal 16 is passed directly to the output 19.

Rows g and h show the situation where the power mode controller is switching off the power to the island 2 which is thus entering power-down. The power mode controller turns the clamp enable signal 18 to one to protect powered on domains by forcing the clamp out signal 19 to correspond to the latch value from the latch 22. As before, the X in the table means that this value is irrelevant to the circuit and will not affect the value of the clamp out signal 19.

The clamp of FIG. 4 thus automatically determines the correct clamp value based on the value being driven during reset. This simplifies the integration of the clamp into the chip as the clamp can act either as a logic 1 or a logic 0 clamp, thus eliminating the error-prone and time-consuming process of manual clamp resolution.

From reading the present disclosure, other variations and modifications will be apparent to persons skilled in the art. Such variations and modifications may involve equivalent and other features which are already known in the art, and which may be used instead of or in addition to features already described herein.

Although claims have been formulated in this application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The Applicants hereby give notice that new Claims may be formulated to such features and/or combinations of such features during the prosecution of the present Application or of any further Application derived therefrom.

The invention claimed is:

1. An integrated circuit comprising:
   a first voltage island; and
   a second voltage island to which power is capable of being switched off in a power-off period and switched on in a power reset period;
   a clamp having:
   an output configured to provide an output signal to the first voltage island;
   an input configured to receive a clamp in signal from the second voltage island;
   an input configured to receive a clamp enable signal;
   an input configured to receive a reset-an signal indicative of the power reset period;
   a latch operable to store a value of the clamp in signal; and
   a NOR gate having as inputs the clamp enable signal and the reset-an signal and providing as an output an enable signal to the latch;
   wherein the latch is operable to clamp the output signal to the stored value in response to the clamp enable signal, in order to protect the first voltage island from a non-stabilized input signal.

2. The integrated circuit according to claim 1, wherein the latch is operable to clamp the output signal to the stored value when power switch-off to the second voltage island commences.

3. The integrated circuit according to claim 1, wherein the latch is operable to clamp the output signal to the stored value when power switch-off to the second voltage island has just terminated.

4. The integrated circuit according to claim 1, wherein the reset-an signal signifies switching on of the power to the second voltage island.

5. The integrated circuit according to claim 1, wherein the output of the latch is connected to one input terminal of a multiplexer, another input terminal of which is fed by the clamp in signal, the multiplexer having an output terminal for carrying the output signal of the clamp.

6. The integrated circuit according to claim 4, wherein the reset-an signal is zero during the reset periods and one during non-reset periods.

7. The integrated circuit according to claim 1, wherein the clamp can act either as a logic one or a logic zero clamp.

* * * * *